United States Patent
Grabianska et al.

(10) Patent No.: US 11,821,108 B2
(45) Date of Patent: Nov. 21, 2023

(54) METHOD FOR REDUCING LATERAL GROWTH OF GAN CRYSTALS IN AN AMMONOTHERMAL CRYSTAL GROWING PROCESS

(71) Applicant: Instytut Wysokich Ciśnień Polskiej Akademii Nauk, Warsaw (PL)

(72) Inventors: Karolina Grabianska, Warsaw (PL); Robert Kucharski, Warsaw (PL); Michal Bockowski, Warsaw (PL)

(73) Assignee: Instytut Wysokich Cisnien Polskiej Akademii Nauk, Warsaw (PL)

( * ) Notice: Subject to any disclaimer, the term of this patent is extended or adjusted under 35 U.S.C. 154(b) by 0 days.

(21) Appl. No.: 17/844,148

(22) Filed: Jun. 20, 2022

(65) Prior Publication Data
US 2022/0411955 A1     Dec. 29, 2022

(30) Foreign Application Priority Data

Jun. 24, 2021    (EP) ..................... 21461556

(51) Int. Cl.
*C30B 7/10*     (2006.01)
*C30B 25/12*     (2006.01)
*C30B 25/18*     (2006.01)
*C30B 29/40*     (2006.01)

(52) U.S. Cl.
CPC .............. *C30B 7/105* (2013.01); *C30B 25/12* (2013.01); *C30B 25/186* (2013.01); *C30B 29/406* (2013.01)

(58) Field of Classification Search
CPC .. C30B 7/00; C30B 7/10; C30B 7/105; C30B 25/00; C30B 25/02; C30B 25/04; C30B 25/12; C30B 25/18; C30B 25/186; C30B 29/00; C30B 29/10; C30B 29/40; C30B 29/403; C30B 29/406
USPC ... 117/11, 54, 58, 63–65, 68, 71, 84, 88–90, 117/94–95, 101, 937, 952
See application file for complete search history.

(56) References Cited

U.S. PATENT DOCUMENTS

| | | | |
|---|---|---|---|
| 10,094,017 B2 | 10/2018 | Pocius | |
| 2003/0209191 A1* | 11/2003 | Purdy | ..................... C30B 25/00 117/84 |
| 2006/0032428 A1* | 2/2006 | Dwilinski | ............. C30B 29/406 117/11 |

(Continued)

FOREIGN PATENT DOCUMENTS

WO     2016090045 A1    6/2016

OTHER PUBLICATIONS

Zajac, et al. publication entitled "Basic ammonothermal growth of gallium nitride—State of the art, challenges, perspectives," Progress in Crystal Growth and Characterization of Materials, vol. 64, pp. 63-74 (2018). (Year: 2018).*

(Continued)

*Primary Examiner* — Kenneth A Bratland, Jr.
(74) *Attorney, Agent, or Firm* — Andrew D. Dorisio; Dickinson Wright PLLC (57) ABSTRACT

The present invention relates to a method for reducing lateral growth as well as growth of the bottom surface of crystals in a crystal growing process, wherein before the crystal seed undergoes a growing process the method includes a step of wrapping the crystal seed with metal foil so that all the side surfaces as well as the bottom surface of the crystal seed are surrounded by the foil.

9 Claims, 4 Drawing Sheets

(56) References Cited

U.S. PATENT DOCUMENTS

2011/0290380 A1* 12/2011 Okayama .............. H01L 23/142
                                                          216/34
2016/0153120 A1*  6/2016 Hashimoto ......... H01L 29/2003
                                                         428/220
2019/0091807 A1   3/2019 Hashimoto et al.

OTHER PUBLICATIONS

Grabianska, Karolina et al., "GaN Single Crystalline Substrates by Ammonthermal and HVPE Methods for Electronic Devices", Electronics, vol. 9, No. 9, Aug. 19, 2020, p. 1342-1-1342-12.
Zajac M et al: "Basic ammonthermal growth of Gallium Nitride—State of the art, challenges, perspectives", Progress in Crystal Growth an Characterization of Materials, Elsevier Publishing, Barking, GB, vol. 64, No. 3, Jun. 2, 2018, pp. 63-74.
Grabianska, Karolina et al., "Recent progress in basic ammonthermal GaN crystal growth", Journal of Crystal Growth (2020), doi: https://doi.org/10.1016/j.jcrysgro.2020.125804.
Kucharski, R. et al.,"Growth of bulk GaN crystals", J. Appl. Phys. 128, 050902 (2020), doi: https://doi.org/10.1063/5.0009900.

* cited by examiner

Figure 1

PRIOR ART

Figure 2

PRIOR ART

METHOD FOR REDUCING LATERAL GROWTH OF GAN CRYSTALS IN AN AMMONOTHERMAL CRYSTAL GROWING PROCESS

This application claims the priority to European Patent Application No. EP21461556.9 filed on Jun. 24, 2021, the disclosure of which is hereby incorporated by reference.

DESCRIPTION

The present invention relates to a method for reducing lateral growth as well as growth of the bottom surface of crystals in a crystal growing process, wherein before the crystal seed undergoes a growing process the method includes a step of wrapping the crystal seed with metal foil so that all the side surfaces as well as the bottom surface of the crystal seed are surrounded by the foil.

STATE OF THE ART

There are many crystal growth methods which employ use of crystal seeds placed on a holder, used to initiate the crystallization process in specific conditions.

One such known method is the ammonothermal method, which includes dissolving the feedstock in supercritical ammonia in the first of two zones of a high-pressure autoclave.

The dissolved feedstock is transported to the second zone, where the solution is supersaturated and crystallization on native seeds occurs. An appropriate temperature gradient between the dissolution (dissolving) and crystallization (growth) zones enables the convective mass transport. In order to enhance the solubility of the feedstock, some mineralizers are added to the dissolution zone. Depending on the type of used mineralizers, the ammonothermal crystal growth can be either basic or acidic. In the ammonoacidic approach halide compounds (with $NH_4^+$ ions) are introduced into the supercritical solution, while in case of the ammonobasic crystallization alkali metals or their amides (with $NH_2^-$ ions) are used.

The ammonothermal method can be used to grow various crystals, including for example aluminum nitride (AlN), indium nitride (InN) and gallium nitride (GaN).
The idea of the basic ammonothermal growth of GaN crystals is generally as follows. Polycrystalline GaN, used as a feedstock, is dissolved in supercritical ammonia in one zone of the reactor. The dissolved material is then transported to the second zone, where the solution is supersaturated and the crystallization of GaN takes place on native seeds. The seeds are usually ammonothermally-grown GaN crystals.

Figure 1:
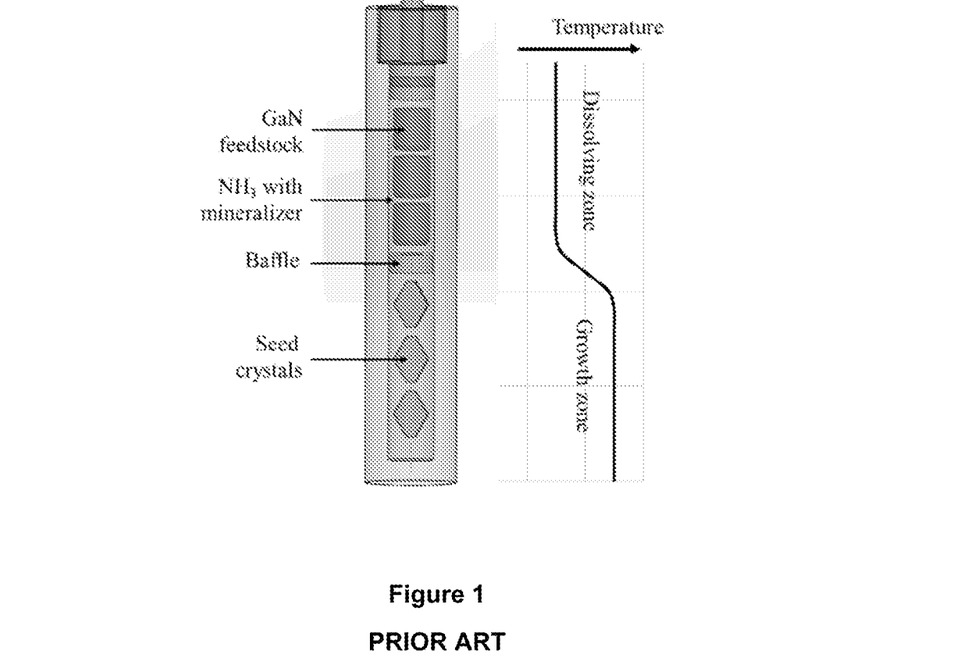
FIG. 1 shows a scheme of basic ammonothermal GaN crystallization known from the prior art, in which GaN feedstock in crucible is in the upper part of the autoclave and GaN seed crystals are in the lower part of the autoclave. The temperature distribution is also presented in this figure.

In this type of method a negative temperature coefficient of solubility is observed. As a consequence, the chemical transport of GaN is directed from the low-temperature solubility zone (with feedstock in crucible) to the high-temperature crystallization zone (with seeds). The GaN feedstock is arranged in the upper part of the reactor and the GaN seeds are placed on special holders in the lower part of the reactor. These two zones are separated by baffles. All of the elements inside the autoclave (reactor) are made of high purity metals that are resistant to ammonothermal conditions. A scheme of the basic ammonothermal GaN crystallization method is presented in FIG. 1, where GaN feedstock in crucible is located in the upper part of the autoclave and GaN seed crystals are located in the lower part of the autoclave. FIG. 1 also presents the temperature distribution in the autoclave.

Ammonothermal crystallization allows to grow GaN of very high structural quality and a low threading dislocation density. Crystals are grown in three main crystallographic directions: <000-1>, <10-10> and <11-20> (on -c, m, and a planes, respectively, as presented in FIG. 2). The main idea of the ammonothermal method is to increase the lateral size of the initial seed (see the scheme presented in FIG. 2). At the same time, the seed is naturally overgrown in the vertical <000-1> direction, but the vertical growth rate is much lower than the lateral one. When the appropriate lateral size is reached, the crystallization should take place only in the <000-1> direction in the next ammonothermal process and the growth in the <0001> direction is always mechanically blocked. After that, the crystal is sliced perpendicularly to the growth direction and it can increase the population of seeds used for subsequent growth runs or wafering process (GaN substrate fabrication).

One of the most important factors limiting the ammonothermal GaN growth in the <000-1> direction is associated with the anisotropy of the growth and crystallization occurring in the lateral directions at the edges of the crystal during the growth in the <000-1> direction. It was shown that different kinds and concentrations of impurities incorporated during the growth process on the non-polar (11-20) and (10-10) facets and on the (000-1) plane are vastly different. This causes stress and cracking of the growing crystals which results in a lower yield (number of new crystals without any cracks) of the ammonothermal process.

Another crystal growth method is the halide vapour phase epitaxy (HVPE) process in which crystal precursor is formed in situ, i.e. in the reaction zone. The reactor is also divided into two zones—source zone and growth zone. For example, in order to produce GaN crystals (or other crystals, such as GaAs or InP) using this method, in the first reaction zone (source zone) group-III metal, such as gallium, reacts with hydrogen chloride (HCl) to produce gaseous metal chloride. This gaseous metal chloride reacts further in the growth zone of the reactor with ammonia. In this growth zone of the reactor, a seed zone can be distinguished in which a suitable crystal seed is placed on a special holder. Due to a reaction of gaseous metal chloride with ammonia, group-III nitride is produced and it grows in the seed zone, increasing the seed's size. This way GaN crystals can be obtained. The main advantage of this method is the high rate (exceeding 100 µm/h) of crystal growth. However, although the purity of the final material is usually high, there are several problems connected with the contamination of the active HCl gas with iron, which is highly undesirable in the field of semiconductors, in which GaN is broadly used.

Grabiańska et al. (GaN *Single Crystalline Substrates* by Ammonothermal and HVPE Methods for Electronic Devices, Electronics 2020, 9(9), 1342) proposed a method for ammonothermal and HVPE growth of stress-free and crack-free GaN, in which lateral growth was eliminated or reduced. This method involves changing the shape of a seed from an irregular (hexagonal) to a round one and masking its edges with a thick metal border (ring). This metal border inhibits the crystallization in all unwanted lateral directions. The growth proceeds in only one, vertical <000-1> direction. The authors also made a remark that it is much easier to provide a metal border around the growing crystal when the seed is round. This method, despite good results regarding the structural quality of the growing crystal, requires a pre-treatment of GaN seeds in order to provide them with a suitable shape corresponding to the shape of the metal barrier.

In another publication, Grabiańska et al. (*Recent progress in basic ammonothermal GaN crystal growth*, Journal of Crystal Growth, Volume 547, 2020, 125804) provided a solution very similar to the one described above, but in which a metal barrier can be provided with gaps in order to partially allow for lateral growth of the crystal. In this document it is stated that the seeds can be of any desirable shape, but a round one is preferable. The shape of the border is, however, fixed and cannot be changed easily.

Publication by Kucharski et al. (*Growth of bulk GaN crystals*, J. Appl. Phys. 128, 050902, 2020) also describes using a metal barrier for limiting lateral crystal growth in the HVPE method. There is no mention of using this method with relation to the ammonothermal growth.

In the publication of PCT application WO2016090045A1 a bulk crystal growth method is described in which top side of the seed crystal is polished in order to obtain a flat, damage-free surface, while the bottom side of the seed crystal is covered with either another seed or a masking material. Exemplary masking materials are: silver foil, nickel foil, vanadium foil or other metal foil. The masking material disables crystal growth on the side covered by this material, while the other side is polished and prepared for bulk crystal growth. The masking material however is not used in order to suppress lateral crystal growth, nor it is used in order to obtain crystals of desired shapes and heights.

U.S. Pat. No. 10,094,017 refers to a method of growing polycrystalline nitride chunks. In this method metal foil comprising at least one of: Mo, W, Ta, Pd, Pt, Ir, or Re is used in the deposition chamber as a substrate for growing crystal chunks. The foil facilitates a large-scale manufacturability of polycrystalline GaN and it functions as a substrate from which the grown chunks can be easily separated without causing the contamination of the crystal. The foil can be folded into a shape providing a higher surface area for crystal growth and thus enabling higher process efficiency.

Based on the above prior art it is evident that there is a need for a method for growing a crystal which would allow for suppressing or eliminating its lateral growth. Such method should be simple and should allow for obtaining a crystal of any desirable shape in an optimal manner. Additionally, the method should be applicable in various known crystal growth processes. Unexpectedly, the present invention fulfils the above mentioned needs.

Subject of the Invention

The technical problem outlined above is solved by a method as defined in appended claim 1.

Advantages of the Invention

The method of the invention allows for eliminating the growth in the main lateral, <10-10> and <11-20>, directions as well as in their families of semi-polar directions during crystallization in the <000-1> direction by applying mechanical borders of a shape adjusted to the shape of the seed. The shape of the mechanical borders can be closely adjusted to the shape of the seed since the metal border is made of at least one layer of the metal foil, but the shape of the mechanical borders can also define the shape of the newly grown crystal (such as round, hexagonal, octagonal, etc.), since the newly grown crystal takes the shape defined by those metal borders.

The method of the invention can be implemented in any crystal growth process in which it is possible to wrap the crystal seed with metal foil.

Furthermore, the height of those metal borders can also be easily adjusted and it defines the height of a newly grown crystal.

Such an approach decreases or entirely eliminates the stress in the newly grown crystals, as well as optimizes the usage of the feedstock material. Also, it disables the formation of crystal facets. This increases the yield of a crystallization process, in terms of the number of crystals used for preparing 2-inch wafers, by about 30% when compared to the crystal growth in the same conditions but without the metal foil.

Additionally, a larger temperature gradient between the dissolution and crystallization zones of the reactor (autoclave), as well as the increased mass of the feedstock material used in the process lead to an increase of efficiency of the crystallization process.

Another important feature of the subject invention is that the materials used for the construction of the metal borders were selected according to their resistance to the conditions of the ammonothermal process. Thanks to that no additional reactions or corrosion can appear. The selected materials do not introduce additional stress in the growing crystal. Moreover, those materials are elastic to a certain degree, thus they even further reduce the stress in the growing crystal. Last but not least, the chosen materials do not introduce any impurities to the growing crystals.

DETAILED DESCRIPTION OF THE INVENTION

Figure 2:
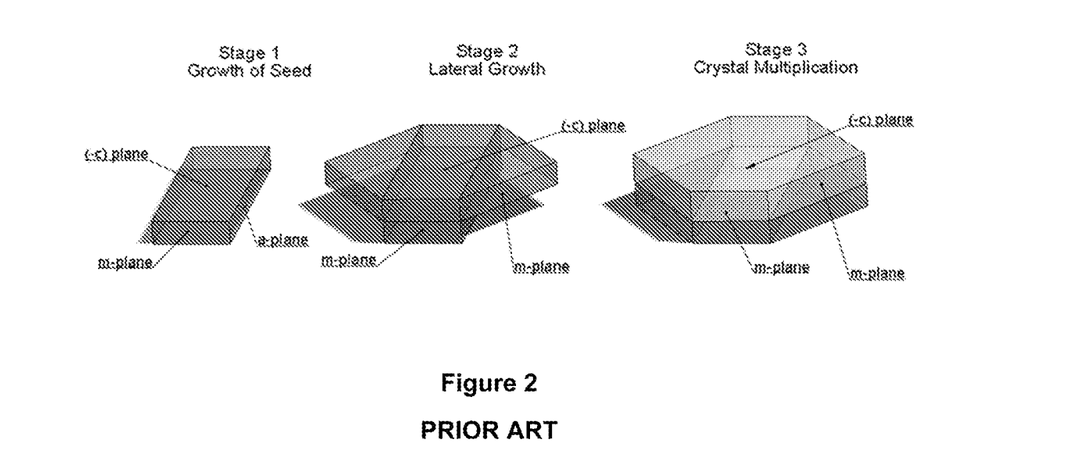
FIG. 2 shows a scheme of three main stages of the ammonothermal crystallization.

Basically for a square crystal seed there are three main planes in which the crystal may grow i.e. m-plane, a-plane (both correspond to lateral growth) and c-plane (corresponds to vertical growth) (see FIG. 2). Those planes can be connected with several crystallographic directions of the growth. In the case of GaN crystal growth process, the main direction of growth in lateral direction is <10-10> and <11-20>. Vertical growth can proceed in the <000-1> direction (upward direction in FIG. 2) or, in <0001> direction (downward direction in FIG. 2).

The purpose of the invention is to force vertical growth of crystals by limiting or eliminating crystallization in directions other than the desired one (in this case the desired direction of vertical growth is <000-1>). It should be however noticed that growth in any direction can be blocked using at least one layer of the metal foil.

To this end, a crystal seed of any shape is wrapped with at least one layer of the metal foil (or at least one layer of the metal foil is folded around the crystal seed) and, therefore, the possibility of any lateral growth is blocked. This wrapping process can be realized manually or by any suitable equipment.

In one embodiment of the invention, the metal foil is wrapped in such a way that the lateral surfaces and bottom of the crystal seed are covered by the foil, while the top side of the crystal remains uncovered. In another embodiment of the invention the lateral surface of the crystal is covered by the foil, while its bottom side remains uncovered.

In a preferred embodiment, the wrapping of the seed crystal with foil starts from its <0001> face. The <0001> surface is wrapped and then all the side walls of the seed crystal are also wrapped. When both the <0001> surface and the side walls of the seed crystal are wrapped in the foil, it is preferred to use two pieces of foil to form two layers on the crystal. When two layers of foil are applied, it is necessary to provide perforations in both foil layers (in an alternate manner) in the area of the <0001> surface of the seed crystal. This will prevent the appearance of bubbles of gas under the foil during unloading of crystals after the growing process. Those bubbles could possibly damage the crystal. However, the perforations can also be employed if a single piece of foil is used.

Regardless of the chosen scheme of wrapping, preferably the shape of the foil in the area of the crystal should closely reflect the shape of the seed crystal. Preferably, the wrapping should be performed in such a manner that the foil adheres to the seed crystal in the best possible way. The foil should be smooth with no visible roughness, especially on the edges of the seed crystal that are parallel to the <0001> axis. Preferably, the foil is subjected to pre-processing by rolling before putting it to use.

Preferably, the present invention can be applied to seed crystals of diameter starting from 2.54 cm (1 inch).

Wrapping seed crystals with at least one layer of the metal foil may be used not only to limit the growth in a desired direction, but also to define the shape and height of a newly-grown crystal. The part of the metal foil extending above the wrapped crystal seed can be shaped into any desired shape, such as hexagonal, octagonal, rectangular, square or irregular in order to provide newly grown crystals of a desired shape. However, the part of the foil extending above crystal seed should not extend further in the lateral direction than the crystal itself. The portion of the metal foil extending above the wrapped crystal (foil height) can be chosen in order to achieve crystals of defined, desired height. Preferably, the metal borders should be as high as the desired future thickness of the newly-grown material. In a preferred embodiment, those side walls created by the foil extend by 2+6 mm above the crystal seed. When the crystal is thicker than the metal borders, i.e. the crystal height becomes larger than the height of the metal foil, the facets can form. This process may however be avoided by ending the crystal growth process with this moment. As a result the growth rate is increased and the stress in the new crystal is lowered.

According to one embodiment of the invention, at least one metal foil layer may be used to wrap the crystal and at least one metal foil layer may be used to give the crystal a specified desired shape. In one embodiment, at least one metal foil layer used to wrap the crystal is made from the same metal as least one metal foil layer used to give the crystal a specified desired shape. In another embodiment, at least one metal foil layer used to wrap the crystal is made from metal different than at least one metal foil layer used to give the crystal a specified desired shape.

Figure 3:
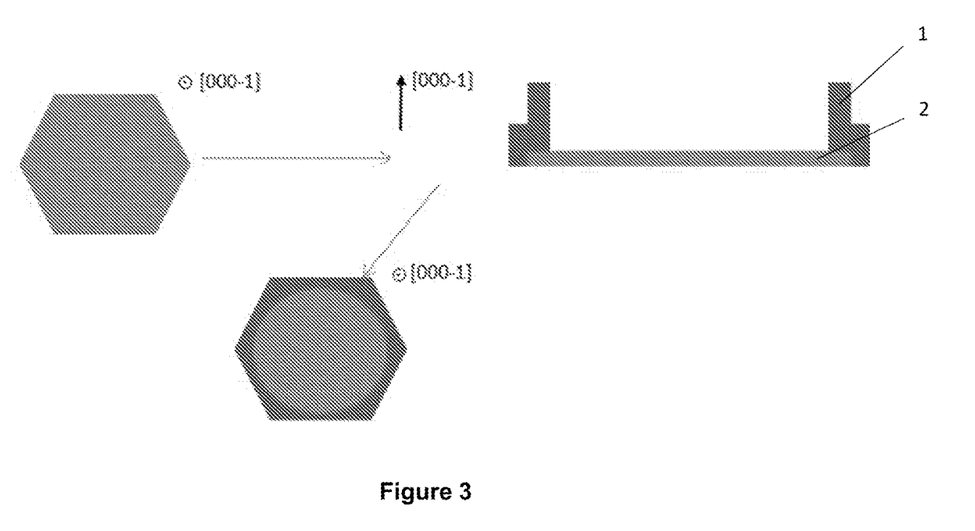
FIG. 3 shows, in a schematic manner, a crystal seed with sides wrapped with metal foil according to one embodiment of the method of the invention.
Figure 4:
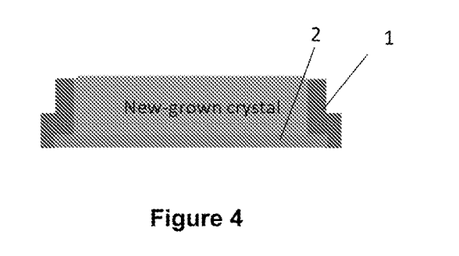
FIG. 4 shows, in a schematic manner, a newly grown crystal at the end of the crystallization process according to the embodiment shown in FIG. 3.

The preferred scheme of the method according to the invention aiming to force a specific, in this case vertical (<000-1>), growth direction for GaN monocrystals by placing a mechanical, metal border—foil 1 on the seed 2 is presented in FIG. 3. The same reference numbers were used in FIGS. 4 and 5. FIG. 4 shows a scheme of the seed with the newly grown crystal at the end of the crystallization process. This figure also demonstrates real as-grown crystals grown with the metal borders and with shapes created by these borders.

Figure 5:
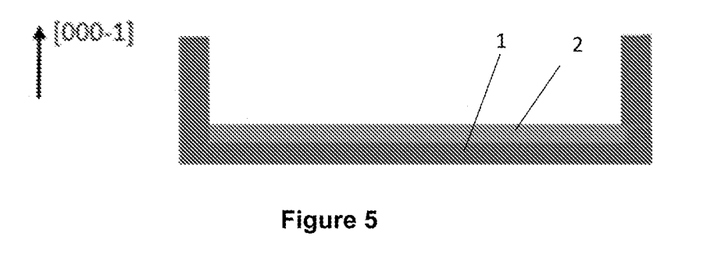
FIG. 5 shows, in a schematic manner, a crystal seed with sides wrapped with metal foil according to another embodiment of the method of the invention.

FIG. 5 presents another embodiment of the method according to the invention. In this embodiment, the crystal seed 2 is wrapped by metal foil 1 in such a manner that both the bottom surface and side surfaces of the crystal seed are covered by metal foil.

The above-described metal barrier can be prepared from several materials such as nickel, silver, molybdenum, titanium, tungsten or metal alloy selected from the group including Ag—Cu, Ag—Ni, Ag—Ti, Cu—Ni, Cu—Ti, Ni—Ti. Those materials are selected according to their resistance to the conditions of the ammonothermal process (or any other conditions in which they are intended to be used), so that no additional reactions or corrosion appear. The thermal expansion of these materials is also an important feature. It should be as close to the coefficient of thermal expansion of GaN as possible in order not to introduce additional stress in the growing crystal. Preferably, it corresponds to the thermal expansion of growing crystal in the temperature range used in the growing process. For example, for GaN growth in ammonothermal conditions the temperature range of interest is from 573 K to 920 K. For the same reason i.e. not imparting additional stress on the growing crystal, the metal foil should also be elastic. Additionally, those materials should be of high purity in order not to introduce any contamination to the reaction solution and to the growing crystals.

The thickness of the metal foil can be in a range between 0.005 mm and 0.05 mm. In a preferred embodiment it is in the range from 0.015 mm to 0.03 mm.

The size of the metal foil in each dimension should be larger by 8+10 mm than the size of the wrapped seed crystal. All side surfaces and the bottom crystallographic surface of the crystal are wrapped in order to give the shape of the growing crystal. Therefore, the size of the wrapping metal foil must be larger than the seed crystal.

The above described method of directing specific growth of crystals may be used for growing of different crystals, such as GaN, AlN and InN.

For the purpose of the subject invention ammonothermal method of GaN crystal growth was chosen, but the directed growth method according to the invention should not be limited only to those conditions.

As described above, in the ammonothermal method crystals are grown in a crystallization zone on special seed holders, on which seeds are placed before starting the reaction. The other part of the reactor, dissolution zone, comprises polycrystalline feedstock and ammonia with mineralizer. During the course of reaction, feedstock is dissolved in supercritical ammonia in the dissolution zone and is transported through a baffle between those two zones to crystallization zone, where it crystallizes on a seed. In order to obtain a directed crystal growth, this seed can be additionally wrapped in metal foil as described above. The conditions for such ammonothermal growth are as follows: temperature ranging from 572 K to 920 K; ammonia pressure of 0.15-0.4 GPa.

Another method, which can be used to grow a desired crystal is for example halide vapour phase epitaxy (HVPE). In this method hydrogen chloride is reacted at elevated temperature with group-III metals to produce gaseous metal chlorides, which then react with ammonia to produce group-III nitrides. This last step proceeds in a growth zone of the reactor on a seed, more specifically in a designated seed zone. As the reaction proceeds, the crystal grows on this seed leading to obtaining a newly-grown crystal. Employing a metal barrier around this seed, as described above, would enable to obtain crystals of desired size, shape and height. The conditions used for growth using this method were as follows: ambient pressure; temperatures of about 750-1300 K.

Overall, the method of the invention comprises the following steps:

(a) wrapping crystal seeds in the at least one layer of the metal foil;

(b) shaping the metal border to provide it with shape and height of the desired newly grown crystal;

(c) introducing wrapped crystals to the crystallization zone of the reactor;

(d) introducing other required substrates and feedstock to the suitable zone of the reactor;

(e) closing the reactor and performing crystal growth process;

(f) finishing the reaction once the crystal reached the upper boundary of the metal foil.

In the above described method other modifications can also be introduced in order to increase the efficiency and yield of the process. The growth rate and therefore crystallization efficiency can be further increased thanks to the following improvements:

increasing the temperature gradient between the crystallization and dissolution zones of the reactor (autoclave);

increasing the surface of the crucibles by means of the feedstock; and increasing the mass of the feedstock material.

The influence of the presented above parameters on the crystal growth process and its results is demonstrated in Table 1.

TABLE 1

Comparing the key process parameters and the results obtained

| Parameters | Classical run | Non-optimal run | Optimal run |
| --- | --- | --- | --- |
| Mineralizer Na:NH$_3$—0.04 | Na | Na | Na |
| Feedstock (GaN) | Standard | +20% | +35% |
| Number of crucibles | 7 | 9 | 9 |
| Time of the run [days] | 62 | 62 | 76 |
| Temperature of the dissolution zone [° C.] | 382 | 361 | 368 |
| Temperature of the growth zone [° C.] | 573 | 596 | 596 |

TABLE 1-continued

Comparing the key process parameters and the results obtained

| Parameters | Classical run | Non-optimal run | Optimal run |
| --- | --- | --- | --- |
| Temperature gradient between the reaction zones [° C.] | 191 | 235 | 228 |
| Metal border (foil) | no | yes | yes |
| Average thickness gain [μm] | 1399 | 2978 | 3019 |
| Growth rate [μm/day] | 26 | 55 | 44 |

As stated above, the method of the invention can be used to modify any crystal growth process employing crystal seeds, preferably placed on a holder, in which it is possible to wrap the crystal seed with metal foil before the growth process is started.

As stated above, both ammonothermal and HVPE methods involve using seed holders for placing seeds in order to perform reactions. Thus, the method of the invention in ammonothermal, HVPE or any other suitable conditions is typically performed using a holder which already includes means for wrapping the crystal seed, such as foil. The crystal seed holder of the invention may be any type of holder, such as plate, vessel, container etc. and it comprises essentially flat base for placing the crystal seed that is attached mechanically to the holder flat surface and wrapped by the metal foil. It should be emphasized that all of the above described properties and functionalities of the metal foil apply to the foil wrapped on the seed.

EXAMPLES

Example 1 (Reference Example, not According to Invention)

Figure 6:
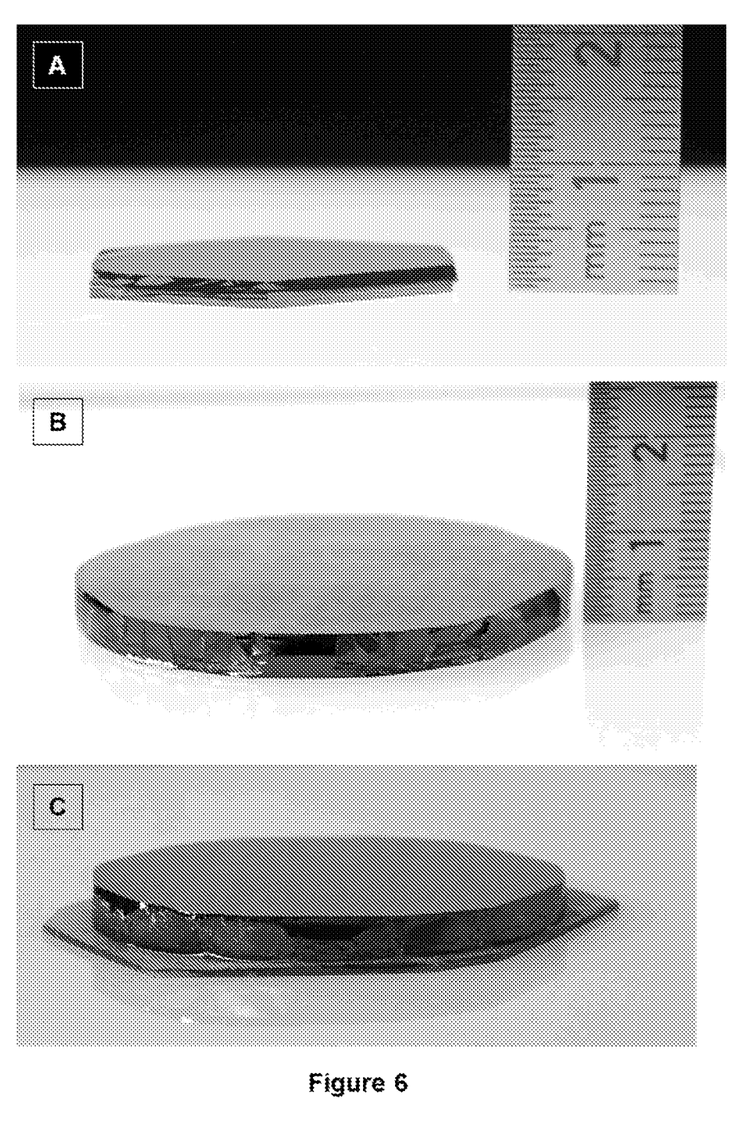
FIG. 6 shows a comparison of crystals obtained according to the method of the present invention (ammonothermal process B and C) and crystal obtained in the same conditions but without using metal foil barriers (A).

In the first example the GaN crystal was grown using ammonothermal method without using a metal barrier. A classical vertical ammonothermal growth reactor was used (see FIG. 1). The crystal growth was performed as follows:

a) A hexagonal GaN crystal with the lateral size of 2 inches and thickness of 0.7 mm was used as a seed. It was placed in the crystallization zone of the reactor on the plate-like seed holder.

b) Polycrystalline GaN in an amount of about 2 kg was placed in the upper dissolution zone of the reactor, separated from the crystallization zone by a baffle. About 300 g of mineralizers were added to the dissolution zone and then ammonia was introduced to the autoclave.

c) The reactor was closed and subjected to an ammonothermal reaction in the following conditions: pressure of about 0.4 GPa, temperature between 573 K and 920 K, with constant monitoring of the course of the reaction;

d) The reaction was finished when all the feedstock material was dissolved in ammonia. The obtained crystal was visually inspected for cracks and its size was measured. The lateral size of the newly grown crystal was the same as the one of the seed and its thickness was 1.5 mm. The resulting crystal is presented in FIG. 6A. The boundary between the crystal seed and the newly grown crystal can be easily noticed and was marked in FIG. 6A.

Example 2

In the second example a GaN crystal was grown by the ammonothermal method using a 4-5N Ag foil of thickness of 0.02 mm-0.03 mm as the metal barrier. A crystal seed was wrapped in the Ag foil before placing it in the crystallization zone of the reactor.

The wrapping process was performed in a following manner. The crystal seed was wrapped twice in such a way that two Ag foil layers were in contact with each other on the whole wrapping area. The seed was wrapped both from sides and the bottom. The wrapping was performed manually providing as close contact of the foil with the side surface of the crystal seed as possible. The shape of the upper layer of the foil was not further modified and the height of the metal foil was equal to about 3 mm.

A classical vertical ammonothermal growth reactor was used (see FIG. 1). The crystal growth was performed as follows:

a) A round GaN crystal with the lateral size of 2 inches and thickness of 0.7 mm was used as a crystal seed. It was placed in the crystallization zone of the reactor on the plate-like seed holder.

b) Polycrystalline GaN in an amount of about 2.7 kg was placed in the upper, dissolution zone of the reactor, separated from the crystallization zone by a baffle. About 400 g of mineralizers were added to the dissolution zone and then ammonia was introduced to the autoclave.

c) The reactor was closed and subjected to ammonothermal reaction in the following conditions: pressure of about 0.4 GPa, temperature between 573 K and 920 K, with constant monitoring of the course of the reaction.

d) The reaction was finished when all the feedstock material was dissolved in ammonia. Obtained crystal was visually inspected for cracks and its size was measured. The diameter of newly grown crystal was the same as the one of the seed, and its thickness was 3 mm. This means that the height of the newly grown crystal increased twice with reference to growth without metal barrier. The result was also captured in a photography and it was presented in FIG. 6B. The edges of the newly grown crystal are much more smooth when visually compared to the reference example.

Example 3

In the third example the GaN crystal was grown by the ammonothermal method using a 4-5N Ni sheet of thickness of 0.1 mm-0.2 mm as the metal barrier. The crystal growth was performed in the same way to that described with reference to Example 2. A crystal seed was wrapped in the Ag foil before placing it in the crystallization zone of the reactor. The Ni foil was used to build a vertical barrier.

a) A hexagonal GaN crystal with the lateral size larger than 2 inches and thickness of 0.7 mm was used as a crystal seed. It was placed in the crystallization zone of the reactor on the plate-like seed holder.

b) Polycrystalline GaN in an amount of about 2.7 kg was placed in the upper dissolution zone of the reactor, separated from the crystallization zone by a baffle. About 400 g of mineralizers were added to the dissolution zone and then ammonia was introduced to the autoclave.

c) The reactor was closed and subjected to the ammonothermal reaction in the following conditions: pressure of about 0.4 GPa, temperature between 573 K and 920 K, with constant monitoring of the course of the reaction.

d) The reaction was finished when all the feedstock material was dissolved in ammonia. The obtained crystal was visually inspected for cracks and its size was measured. The diameter of the newly grown crystal was smaller than that of the seed. The thickness of the newly grown crystal was 3 mm. The result was also captured in a photograph and it is presented in FIG. 6C.

The invention claimed is:

1. A method for reducing lateral growth of GaN crystals in an ammonothermal crystal growing process, wherein before the crystal seed undergoes Rail the growing process the method includes a step of wrapping the crystal seed with at least one layer of a metal foil so that all the side surfaces, defined as (10-10) and (11-20) planes of the crystal seed are surrounded by the foil, whereby the wrapped metal foil extending above the crystal seed is shaped into the desired shape of the newly grown crystal and the height of metallic borders formed by the metal foil wrapped around the crystal seed defines the height of a newly grown crystal.

2. The method according to claim 1, wherein the metal foil is made of metal selected from the group including nickel, silver, molybdenum, titanium and tungsten or metal alloy selected from the group including Ag—Cu, Ag—Ni, Ag—Ti, Cu—Ni, Cu—Ti, Ni—Ti.

3. The method according to claim 1, wherein the metal foil has a thickness between about 0.005 mm and about 0.05 mm, preferably in the range from about 0.015 mm to about 0.03 mm.

4. The method according to claim 1, wherein the step of wrapping the crystal seed includes also covering the bottom side of the crystal seed with the metal foil.

5. The method according to claim 1, wherein the crystal seed is placed on a crystal seed holder.

6. The method of claim 1, wherein at least one metal foil layer is used to wrap the crystal seed and at least one metal foil layer is used to give the newly grown crystal a specified desired shape.

7. The method of claim 1, wherein at least one metal foil layer used to wrap the crystal seed is made from metal different from at least one metal foil layer used to give the newly grown crystal a specified desired shape.

8. The method according to claim 1, wherein the temperature gradient between the dissolution and crystallization zones of an ammonothermal reactor is in the range of 150 K to 250 K.

9. The method according to claim 1, wherein the molar ratio of gallium to ammonia is in a range from 0.1 to 0.2.

* * * * *

UNITED STATES PATENT AND TRADEMARK OFFICE
CERTIFICATE OF CORRECTION

PATENT NO. : 11,821,108 B2
APPLICATION NO. : 17/844148
DATED : November 21, 2023
INVENTOR(S) : Grabianska et al.

Page 1 of 1

It is certified that error appears in the above-identified patent and that said Letters Patent is hereby corrected as shown below:

In the Claims

Column 10, Claim 1, Line 19 - please delete "Rail"

Signed and Sealed this
Thirteenth Day of February, 2024

Katherine Kelly Vidal
*Director of the United States Patent and Trademark Office*